(12) United States Patent
Kurauchi et al.

(10) Patent No.: US 9,491,867 B2
(45) Date of Patent: Nov. 8, 2016

(54) WIRING SUBSTRATE AND MULTI-PIECE WIRING SUBSTRATE

(71) Applicant: NGK SPARK PLUG CO., LTD., Nagoya-shi, Aichi (JP)

(72) Inventors: Takashi Kurauchi, Kasugai (JP); Yoshitaka Yoshida, Kounan (JP); Kazushige Akita, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 14/868,547

(22) Filed: Sep. 29, 2015

(65) Prior Publication Data

US 2016/0095217 A1    Mar. 31, 2016

(30) Foreign Application Priority Data

Sep. 30, 2014  (JP) ................. 2014-200525
Jul. 17, 2015  (JP) ................. 2015-142725

(51) Int. Cl.
*H05K 7/00*  (2006.01)
*H05K 1/11*  (2006.01)
*H05K 3/24*  (2006.01)
*H05K 3/00*  (2006.01)
*H03H 9/10*  (2006.01)

(52) U.S. Cl.
CPC ............ *H05K 3/242* (2013.01); *H03H 9/1014* (2013.01); *H05K 1/113* (2013.01); *H05K 3/0052* (2013.01); *H05K 2203/175* (2013.01)

(58) Field of Classification Search
CPC ...... H05K 1/11; H05K 1/115; H05K 1/0298; H05K 2201/10628
See application file for complete search history.

(56) References Cited

U.S. PATENT DOCUMENTS

| | | | | |
|---|---|---|---|---|
| 6,004,867 A | * | 12/1999 | Kim | ............... H01L 23/3114 257/E21.511 |
| 6,384,425 B1 | * | 5/2002 | Huber | ............ G06K 19/07743 257/48 |
| 7,023,083 B2 | * | 4/2006 | Jakobsen | ............... H01L 21/50 257/659 |
| 7,115,443 B2 | * | 10/2006 | In't Veld | ............. B28D 5/0076 257/E21.237 |
| 7,220,921 B1 | * | 5/2007 | Sakamoto | .......... H01L 21/4832 174/255 |
| 8,080,869 B2 | * | 12/2011 | Okudo | ............... B81C 1/00269 257/704 |
| 8,975,736 B2 | * | 3/2015 | Okuno | .................. H01L 21/50 257/684 |

(Continued)

FOREIGN PATENT DOCUMENTS

JP        2008-005088 A1    1/2008

*Primary Examiner* — Hoa C Nguyen
(74) *Attorney, Agent, or Firm* — Stites & Harbison, PLLC; Jeffrey A. Haeberlin; James R. Hayne (57) ABSTRACT

A wiring substrate includes: a substrate body made of ceramic and having a front surface and a rear surface, each having a rectangular shape in a plan view, a plurality of rear surface electrodes formed on the rear surface of the substrate body, a frame-shaped conductive portion provided on the front surface side of the substrate body, and a via conductor penetrating the substrate body and establishing electric connection between the plurality of rear surface electrodes and the frame-shaped conductive portion. A part of the rear surface is exposed between the plurality of rear surface electrodes and each side of the rear surface of the substrate body. On the rear surface of the substrate body, at least one projecting wiring is formed between each of the plurality of rear surface electrodes and each of a corresponding pair of the sides that intersect with each other.

6 Claims, 6 Drawing Sheets

(56) References Cited

U.S. PATENT DOCUMENTS

2005/0184626 A1* 8/2005 Chiba ............... H03H 9/1021
  310/348
2013/0183475 A1* 7/2013 Yoshida ............... H05K 1/0306
  428/43
2014/0174803 A1* 6/2014 Suzuki ................ H05K 1/0306
  174/258

* cited by examiner

WIRING SUBSTRATE AND MULTI-PIECE WIRING SUBSTRATE

CROSS REFERENCE TO RELATED APPLICATIONS

The present application claims priority to Japanese Patent Application Nos. 2014-200525 and 2015-142725, which were filed on Sep. 30, 2014 and Jul. 17, 2015, respectively, the disclosures of which are herein incorporated by reference in their entirety.

BACKGROUND OF THE INVENTION

1. Field of the Invention

The present invention relates to a wiring substrate which allows various electronic components such as a crystal oscillator to be mounted on a surface thereof so that the electronic components can be sealed, and a multi-piece wiring substrate including a plurality of the wiring substrates.

2. Description of Related Art

For example, a package for piezoelectric oscillator is proposed which includes a substrate formed by an insulating sheet, a pair of oscillation piece mount electrodes formed on a front surface of the substrate, four external connection electrodes respectively formed on four corner sides of a rear surface of the substrate, and a metal ring having a rectangular frame shape and fixed along the periphery of the front surface (for example, see Patent Document 1). Lower ends of a pair of vias, whose upper ends are respectively connected to the oscillation piece mount electrodes and which penetrate the substrate, are respectively connected to a pair of lead-out electrodes extending toward the center of the rear surface from a pair of the external connection electrodes diagonally located on the rear surface.

According to the above package for piezoelectric oscillator, even if a thin substrate is used, in a manufacturing process of a piezoelectric oscillator using the package, or the like, crack is less likely to occur and reliability is ensured. Therefore, the package and the piezoelectric oscillator with a reduced size and a reduced thickness can be obtained.

However, in the case of the package for piezoelectric oscillator disclosed in Patent Document 1, in the first embodiment shown in FIGS. 1(a) to 1(c), when a plurality of the packages are arranged in series along a right-left direction in FIGS. 1(a) to 1(c) and current is applied for covering a surface of each conductor exposed to outside with a metal plating film, the current flows through: a first route of external connection electrode 17c→via 16→metal ring 15→via 16→external connection electrode 17d→external connection electrode 17a of adjacent package→lead-out electrode 18→via 14a→oscillation piece mount electrode 12a; a second route of external connection electrode 17a→lead-out electrode 18→via 14a→oscillation piece mount electrode 12a; and a third route of external connection electrode 17b→lead-out electrode 18→via 14b→oscillation piece mount electrode 12b. As a result, in the case of the package for piezoelectric oscillator, when a surface of each conductor exposed to outside is to be covered with a metal plating film in each individual package, a plurality of routes of plating currents are needed. Further, in a multi-piece configuration, it is impossible to cover a surface of each conductor exposed to outside with a metal plating film per a plurality of packages. Therefore, it is significantly difficult to provide a package for piezoelectric oscillator in which a surface of each conductor exposed to outside is reliably covered with a metal plating film.

RELATED ART DOCUMENTS

Patent Document 1 is Japanese Patent Application Laid-Open (kokai) No. 2008-5088 (pages 1 to 11, FIGS. 1 to 5).

SUMMARY OF THE INVENTION

The present invention has been made to solve the problem described in Background Art, and an object of the present invention is to provide: a wiring substrate which allows various electronic components such as a crystal oscillator to be mounted on a surface of a substrate body so that the electronic components can be sealed, allows a surface of a conductor exposed to outside to be reliably covered with a metal plating film, and suppresses occurrence of trouble of a rear surface electrode upon mounting to a motherboard; and a multi-piece wiring substrate including a plurality of the wiring substrates.

The present invention has been made, in order to solve the above problem, based on an idea that, in a multi-piece wiring substrate including a plurality of the wiring substrates, a surface of a conductor exposed to outside on each wiring substrate is reliably covered with a metal plating film, and a plurality of rear surface electrodes formed on a rear surface of a substrate body of each wiring substrate that has been divided individually are formed so as to be separated from each side of the rear surface.

That is, a wiring substrate (claim 1) of the present invention includes: a substrate body made of insulating material and having a front surface and a rear surface, the front surface and the rear surface each having a rectangular shape in a plan view and the rear surface having edges; a plurality of rear surface electrodes formed on the rear surface of the substrate body, each of the plurality of rear surface electrodes positioned adjacent to a corresponding pair of edges (sides) of the rear surface that intersect with each other, and with a part of the rear surface exposed between the plurality of rear surface electrodes and each edge (side) of the rear surface; a frame-shaped conductive portion provided on a front surface side of the substrate body and having a rectangular frame shape in a plan view; a via conductor penetrating the substrate body and establishing electric connection between the plurality of rear surface electrodes and the frame-shaped conductive portion; and at least one projecting wiring formed on the rear surface of the substrate body between each of the plurality of rear surface electrodes and each of the corresponding pair of edges (sides) adjacent to the rear surface electrode.

In the above configuration, since the plurality of rear surface electrodes formed on the rear surface of the substrate body are formed so as to be separated from each side of the rear surface, stress due to a tensile force occurring when solder or the like used for mounting the wiring substrate on a motherboard such as a printed board is solidified can be reduced. Therefore, it becomes possible to suppress occurrence of trouble such as peeling of the outer circumferential sides of the rear surface electrodes.

In addition, at least one projecting wiring is formed between each rear surface electrode and each of the corresponding pair of sides that intersect (orthogonally) with each other on the rear surface of the substrate body. Therefore, in a multi-piece wiring substrate described later which includes a plurality of the wiring substrates arranged along the longitudinal direction and the transverse direction, at least one connection wiring comprised of the projecting wirings of the wiring substrates adjacent to each other is provided for each side of the rear surface of each substrate body. Therefore, when plating current is applied to the plurality of wiring substrates, the plating current can flow along the longitudinal direction, the transverse direction, and the oblique direction on the plurality of wiring substrates. Therefore, it is possible to provide a wiring substrate in which surfaces of conductive portions exposed to outside, such as the plurality of rear surface electrodes, the frame-shaped conductive portion, and a mount electrode formed on the front surface of the substrate body, are reliably covered with desired metal plating films.

The insulating material forming the substrate body is ceramic or resin. Examples of the ceramic include high-temperature fired ceramic such as alumina, aluminum nitride, or mullite, and low-temperature fired ceramic such as glass-ceramic. Examples of the resin include epoxy resin.

The substrate body is comprised of a single ceramic layer or a single resin layer. Alternatively, the substrate body may be formed as a stacked body of a plurality of ceramic layers or a plurality of resin layers, and between these layers, for example, a routing wiring layer may be formed for connecting the via conductor on the upper layer side and the via conductor on the lower layer side. For example, in the case where the substrate body is formed by stacking a flat-plate ceramic layer and a ceramic layer having a rectangular frame shape in a plan view, the front surface of the substrate body has a rectangular outer shape in a plan view and presents a rectangular frame shape.

The frame-shaped conductive portion provided on the front surface side of the substrate body and having a rectangular frame shape is a metal frame, or a frame-shaped metalized layer formed on a surface (front surface) of a rectangular frame body made of insulating material (for example, a ceramic layer) and stacked along the periphery on a surface of an upper insulating layer (for example, a ceramic layer) of the substrate body.

On the front surface of the substrate body surrounded by the metal frame or the frame body forming the frame-shaped conductive portion, a plurality of mount electrodes for mounting a crystal oscillator, a semiconductor element, or the like are formed, and also, the plurality of mount electrodes and the plurality of rear surface electrodes are electrically connected to each other, respectively, by via conductors.

Examples of arrangement of the rear surface electrodes include arrangement in which a pair of (two) rear surface electrodes are provided along the vicinities of a pair of opposed sides on the rear surface of the substrate body, and arrangement in which one rear surface electrode is provided along the vicinity of a side between two adjacent corners, and two rear surface electrodes are respectively provided on the other two corner sides, that is, a total of three rear surface electrodes are provided.

On the rear surface of the substrate body, among a plurality of projecting wirings provided on each rear surface electrode and extending to a pair of adjacent sides that intersect each other, base portions of at least two projecting wirings that are adjacent to each other via a corner are directly connected to the rear surface electrode without intersecting with each other.

The projecting wiring may linearly extend in a direction orthogonal or oblique to the closest side on the rear surface of the substrate body, or may extend in an L shape in a bottom view with an end thereof being orthogonal to the side.

The thicknesses of the rear surface electrode and the projecting wiring are within a range of about 10 to 50 μm, and the width of the projecting wiring is within a range of about 10 to 300 μm.

In addition, the present invention includes a wiring substrate (claim 2) in which the rear surface of the substrate body has four corners and one of the plurality of rear surface electrodes is formed on the rear surface of the substrate body at each of the four corners of the rear surface, and the at least one projecting wiring is formed between each rear surface electrode and each of the corresponding pair of the sides that intersect with each other.

In this configuration, at least one projecting wiring is formed between each of the four rear surface electrodes formed on the rear surface of the substrate body, and each of the corresponding pair of sides that intersect (orthogonally) with each other on the rear surface. Therefore, in a multi-piece wiring substrate described later, between the adjacent wiring substrates, at least two connection wirings comprised of their mutual projecting wirings are formed for each side of the rear surface of each substrate body. As a result, when plating current is applied to each of the plurality of wiring substrates, the plating current stably flows along the longitudinal direction, the transverse direction, and the oblique direction on the plurality of wiring substrates. Therefore, it is possible to provide a wiring substrate in which surfaces of the rear surface electrodes and the like exposed to outside are further reliably covered with metal plating films.

When the plating current is applied to each of the plurality of wiring substrates, the plating current flows along a plurality of directions (the longitudinal direction, the transverse direction, and the oblique direction in a plan view) on the plurality of wiring substrates. Therefore, it becomes possible to uniform the thicknesses of the metal plating films covering the surfaces of the rear surface electrodes and the like exposed to outside. In addition, since the plating current flows along the plurality of directions (current application routes), for example, even if one of the plurality of current application routes is disconnected, the surfaces of the rear surface electrodes and the like exposed to outside can be reliably covered with the metal plating films.

The present invention may include a wiring substrate in which a plurality of mount electrodes are formed on the front surface of the substrate body surrounded by the frame-shaped conductive portion in a plan view, and the plurality of mount electrodes and the plurality of rear surface electrodes are also electrically connected to each other, respectively, by via conductors penetrating the substrate body.

In this case, in a multi-piece wiring substrate described later, plating current flows to each of the plurality of mount electrodes via the corresponding rear surface electrode and the corresponding via conductor, so that the surface of each mount electrode is also reliably covered with a metal plating film.

A multi-piece wiring substrate (claim 3) according to the present invention includes: a product region having a peripheral side and including a plurality of the wiring substrates arranged adjacently along each of a longitudinal direction and a transverse direction in a plan view with a boundary between each of the plurality of wiring substrates; a marginal portion made of the same insulating material as the substrate body of each of the plurality of wiring substrate, having a front surface and a rear surface, surrounding the product region, and presenting a rectangular frame shape in a plan view; a plurality of plating electrodes formed at a periphery of the marginal portion; and a plating wiring establishing electric connection between each plating electrode of the marginal portion and the projecting wirings of each wiring substrate of the plurality of wiring substrates that is located on the peripheral side of the product region, wherein a pair of adjacent wiring substrates are electrically connected to each other via a connection wiring crossing the boundary between the pair of adjacent wiring substrates, the connection wiring including one projection wiring of each of the pair of adjacent wiring substrates.

In this configuration, when current is applied with an electrode rod or the like brought into contact with the plating electrode on one of opposed sides of the marginal portion, the plating current flows via the plating wiring and the connection wiring through the rear surface electrode, the connection wiring, and the plating wiring on the opposite side on each wiring substrate in the product region, and thereafter, flows to the plating electrode on the other opposed side of the marginal portion. Alternatively, via the plating wiring and the connection wiring, the plating current flows from the rear surface electrode of each wiring substrate in the product region, via the via conductor and the frame-shaped conductor, through another rear surface electrode, the connection wiring, the rear surface electrode and the like of the adjacent wiring substrate, and then the plating wiring on the opposite side, and thereafter, flows to the plating electrode on the other opposed side of the marginal portion. At this time, the plating current reliably flows along the longitudinal direction, the transverse direction, and the oblique direction via the connection wirings between the rear surface electrodes of the plurality of wiring substrates that are adjacent to each other in the longitudinal direction and the transverse direction in the product region. Thus, a multi-piece wiring substrate is provided in which, in each wiring substrate, surfaces of the rear surface electrodes, the frame-shaped conductive portion, and the like, which are exposed to outside, are reliably covered with desired metal plating films made of, for example, Ni or Au.

The plating electrode formed on each side of the marginal portion of the multi-piece wiring substrate is a semicylindrical conductive portion formed along an inner wall surface having a concave groove shape dented in a semicircular shape in a plan view.

As for the plating wiring formed on the marginal portion of the multi-piece wiring substrate, in order to make a connection between the plating electrode and end portions of the plurality of projecting wirings extending to the marginal portion side from the rear surface electrodes of a plurality of wiring substrates located on the peripheral side of the product region which is close to the side of the marginal portion on which the plating electrode is located, the plating wiring may radially extend from the plating electrode to each end portion of the plurality of projecting wirings, or may be composed of a trunk line portion elongated along the side of the rear surface of the marginal portion, a root line portion extending from the trunk line portion to the plating electrode, and a plurality of branch line portions extending from the trunk line portion to each end portion of the plurality of projecting wirings.

In addition, the present invention includes a multi-piece wiring substrate (claim 4) in which, a division groove is formed on a front surface side of the product region along the boundary between each of the plurality of wiring substrates, the division groove having a lattice shape in a plan view.

In this configuration, for example, in the case where the substrate body is made of ceramic, a plurality of the wiring substrates can be easily and accurately obtained by applying a shearing force along the division groove.

The boundary is a virtual line (vertical plane) partitioning the wiring substrates that are adjacent to each other in a plan view, and presents a lattice shape as a whole in a plan view.

The division groove may have a cross section presenting a U shape by a laser process, or may have a cross section presenting a V shape by insertion of an edged tool.

The connection wiring connecting the rear surface electrodes of the two wiring substrates that are adjacent to each other via the boundary becomes the projecting wiring of each of the two wiring substrates when the plurality of wiring substrates are divided into individual pieces along the division groove.

Also in the case where the substrate body of each wiring substrate and the marginal portion are made of resin, the division groove may be formed by an edged tool being inserted by a desired depth along the boundary from the front surface side.

DETAILED DESCRIPTION OF EXEMPLARY EMBODIMENTS OF THE INVENTION

Hereinafter, modes for carrying out the present invention will be described.

Figure 1:
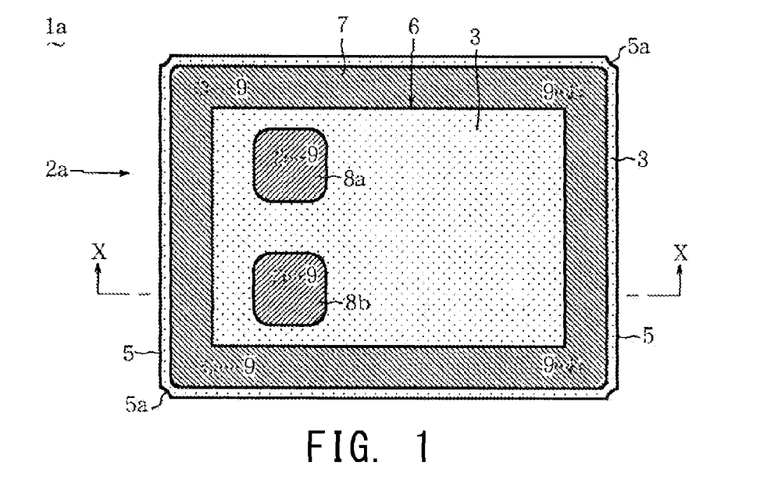
FIG. 1 is a plan view showing a wiring substrate according to an embodiment of the present invention.
Figure 2:
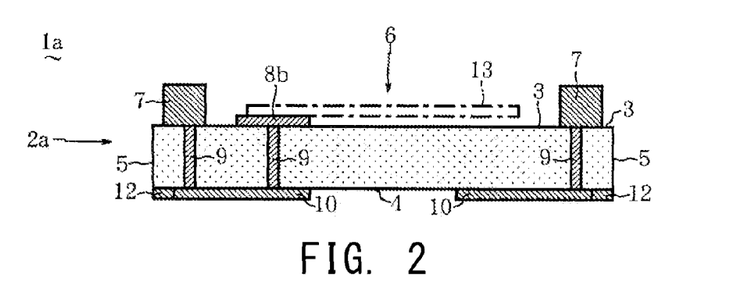
FIG. 2 is a vertical sectional view as seen from an X-X arrow direction in FIG. 1.
Figure 3:
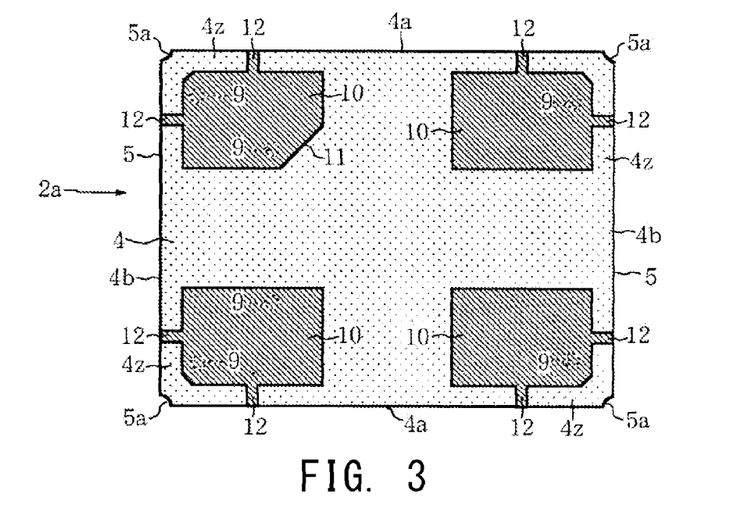
FIG. 3 is a bottom view of the wiring substrate.

FIG. 1 is a plan view showing a wiring substrate 1a according to an embodiment of the present invention. FIG. 2 is a vertical sectional view as seen from an X-X arrow direction in FIG. 1. FIG. 3 is a bottom view of the wiring substrate 1a.

As shown in FIGS. 1 to 3, the wiring substrate 1a includes: a substrate body 2a made of ceramic (insulating material), and having a front surface 3 and a rear surface 4 having rectangular shapes in a plan view, and side surfaces 5 at four sides; four (a plurality of) rear surface electrodes 10 formed on respective corner sides on the rear surface 4 of the substrate body 2a; a metal ring (frame-shaped conductive portion) 7 provided along the periphery of the front surface 3 of the substrate body 2 and having a rectangular frame shape in a plan view; and a plurality of via conductors 9 individually penetrating between the front surface 3 and the rear surface 4 of the substrate body 2, for establishing electric conduction between the metal ring 7 and the four rear surface electrodes 10.

A single ceramic layer forming the substrate body 2a is made of, for example, high-temperature fired ceramic such as alumina, or a low-temperature fired ceramic such as glass-ceramic. Arc walls 5a for preventing chipping or preventing cracking are formed between respective adjacent side surfaces 5 at four sides of the substrate body 2a.

The four rear surface electrodes 10 present rectangular shapes in a bottom view. A part 4z of the rear surface 4 is exposed in a belt shape, between each of the four rear surface electrodes 10, and each of long edges (sides) 4a and short edges (sides) 4b of the rear surface 4 of the substrate body 2a. One projecting wiring 12 is formed so as to orthogonally and linearly extend from each outer side of each rear surface electrode 10 to each of the corresponding pair of the long side 4a and the short side 4b that intersect orthogonally to each other in a bottom view and are adjacent to each other. The projecting wirings 12 present rectangular shapes in a bottom view, but are not limited to such a shape.

In FIG. 3, the rear surface electrode 10 located on an upper left side of the rear surface 4 of the substrate body 2 has an oblique side 11 for identifying a position and an orientation of the substrate body 2a itself or the like. The thicknesses of the rear surface electrode 10 and the projecting wiring 12 are within a range of about 10 to 50 μm, and the width of the projecting wiring 12 is within a range of about 10 to 300 μm.

The metal ring 7 is made of, for example, kovar (Fe-29% Ni-17% Co), alloy 42 (Fe-42% Ni), or alloy 194 (Cu-2.3%-0.03% P). The vertical cross section at any part of the metal ring 7 is almost a square shape. The metal ring 7 is fixed on the peripheral part of the front surface 3 of the substrate body 2a via brazing material (not shown) such as Ag solder provided between the entire bottom surface of the metal ring 7 and the peripheral part of the front surface 3. A cavity 6 having a rectangular shape in a plan view is formed so as to be surrounded by the inner side surface of the metal ring 7 and the front surface 3 of the substrate body 2a. A pair of mount electrodes 8a and 8b are formed on the front surface 3, of the substrate body 2a, which is surrounded by the metal ring 7 in a plan view and also serves as a bottom surface of the cavity 6. On upper surfaces of the mount electrodes 8a and 8b, one end of a crystal oscillator 13 or the like is to be connected later, and the via conductors 9 are respectively connected between the mount electrodes 8a and 8b and a pair of the rear surface electrodes 10 located at the left in FIG. 2.

In order to seal an opening of the cavity 6 in which the crystal oscillator 13 or the like has been mounted, a metal lid (not shown) having a rectangular shape in a plan view is later joined to an upper surface of the metal ring 7 by means of, resistance welding, brazing, or the like. Instead of the crystal oscillator 13, a semiconductor element (not shown) or the like may be mounted in the cavity 6. In this case, three or more (for example, four) mount electrodes may be provided and may be electrically connected to the rear surface electrodes 10 located almost directly under the respective mount electrodes, via the via conductors 9.

The pair of mount electrodes 8a and 8b, the plurality of via conductors 9, and the four rear surface electrodes 10 each having the pair of projecting wirings 12 extending therefrom are formed by printing with W, Mo, Cu, or the like in the case where the substrate body 2a is formed by high-temperature fired ceramic such as alumina, or are formed by printing with Ag, Cu, or the like in the case where the substrate body 2a is formed by low-temperature fired ceramic such as glass-ceramic.

The projecting wirings 12 are not limited to such a configuration that they cross (the part 4z of the rear surface 4) between the corresponding rear surface electrodes 10 and the respective sides 4a and 4b of the substrate body 2a, orthogonally and in a straight line with a shortest distance. The projecting wirings 12 may extend along an oblique direction, or may present any shape such as a trapezoidal shape in a bottom view.

Figure 4:
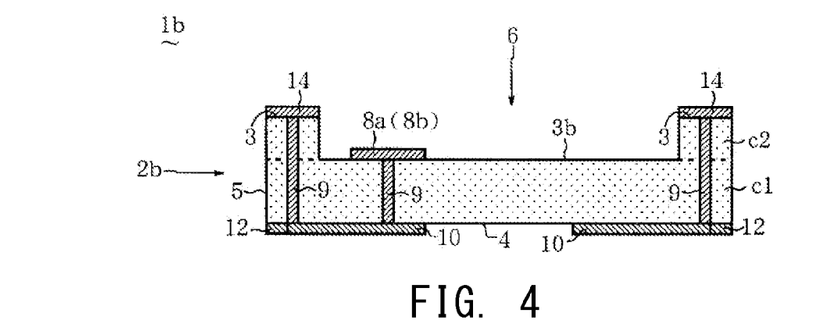
FIG. 4 is a vertical sectional view showing a wiring substrate according to another embodiment, as in FIG. 2.

FIG. 4 is a vertical sectional view showing a wiring substrate 1b according to an embodiment different from the embodiment for the wiring substrate 1a, as in FIG. 2.

As shown in FIG. 4, the wiring substrate 1b has a substrate body 2b instead of the substrate body 2a, and includes a frame-shaped metalized layer (frame-shaped conductive portion) 14 formed on the front surface 3 of the substrate body 2b and having a rectangular frame shape in a plan view, instead of the metal ring 7. The substrate body 2b is obtained by integrally stacking, on a flat-plate ceramic layer c1, a ceramic layer c2 which presents a rectangular frame shape in a plan view and whose vertical cross section is almost a rectangular shape, along the periphery of a front surface 3b of the flat-plate ceramic layer c1. The front surface 3 has a rectangular outer shape in a plan view and presents a rectangular frame shape. The frame-shaped metalized layer 14 is also formed by the same conductor layer by printing with W, Mo, Cu, or the like as described above.

On the rear surface 4 of the substrate body 2b, the same four rear surface electrodes 10 as described above are provided, and the same projecting wirings 12 as described above are provided which extend from outer sides of the rear surface electrodes 10 to respective long sides 4a and short sides 4b of the rear surface 4. On a front surface 3b, of the lower-side ceramic layer c1, surrounded by the upper-side ceramic layer c2, the same cavity 6 as described above is formed. On the front surface 3b which also serves as a bottom surface of the cavity 6, the same mount electrodes 8a and 8b as described above are formed.

As shown in FIG. 4, via conductors 9 penetrating the ceramic layers c1 and c2 are respectively provided between the frame-shaped metalized layer 14 and the four rear surface conductors 10, and via conductors 9 penetrating the lower-side ceramic layer c1 are respectively provided between the mount electrodes 8a and 8b and the two rear surface conductors 10 located at the left in FIG. 4.

Figure 5:
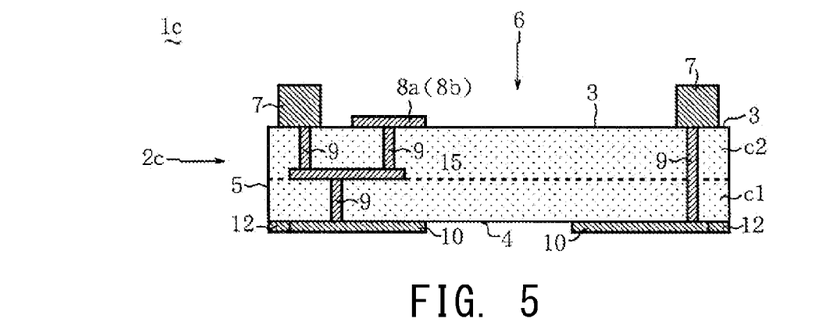
FIG. 5 is a vertical sectional view showing a wiring substrate according to still another embodiment, as in FIG. 2.

FIG. 5 is a vertical sectional view showing a wiring substrate 1c according to an embodiment different from the embodiment for the wiring substrates 1a and 1b, as in FIG. 2.

As shown in FIG. 5, the wiring substrate 1c has a substrate body 2c obtained by integrally stacking a flat ceramic layer c1 on a lower side and a flat ceramic layer c2 on an upper side, instead of the substrate body 2a. A metal ring 7 having a rectangular frame shape in a plan view is fixed along the periphery of a front surface 3 of the substrate body 2c in the same manner as described above. Between the ceramic layers c1 and c2, for example, as shown in FIG. 5, a linking wiring 15 is formed which connects a plurality of via conductors 9 penetrating the ceramic layer c2 and extending downward from the mount electrodes 8a and 8b formed on the front surface 3 which is surrounded by the metal ring 7 and also serves as the bottom surface of the cavity 6. The other via conductors 9 penetrate both ceramic layers c1 and c2 or penetrate only the lower-side ceramic layer c1, as shown in FIG. 5. Between the ceramic layers c1 and c2, a power supply layer, a ground layer (not shown), or the like may be formed.

Figure 6:
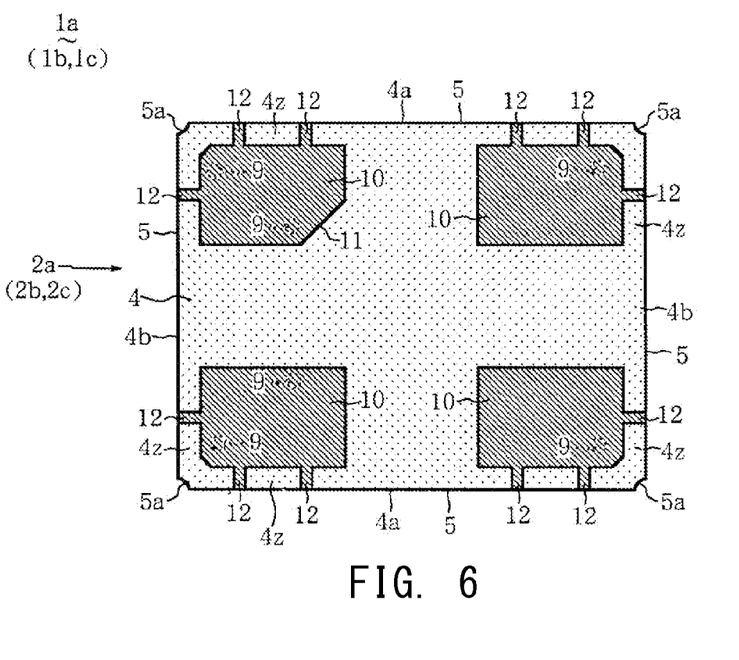
FIG. 6 is a bottom view of the wiring substrate having rear surface electrodes according to an application embodiment.

FIG. 6 is a bottom view of the wiring substrate 1a having rear surface electrodes 10 according to an application embodiment.

As shown in FIG. 6, on a rear surface 4 of a substrate body 2a of the wiring substrate 1a, four rear surface electrodes 10 are formed on respective corner sides of the rear surface 4 in the same manner as described above, and one projecting wiring 12 is formed between each rear surface electrode 10 and the corresponding short side 4b of the rear surface 4, in the same manner as described above. Further, two projecting wirings 12 are formed between each rear surface electrode 10 and the corresponding long side 4a of the rear surface 4.

Thus, in the configuration shown in FIG. 6, on the rear surface 4 of the substrate body 2a, between each of the four rear surface electrodes 10 formed on the respective corner sides of the rear surface 4, and the corresponding pair of the sides 4a and 4b that intersect orthogonally to each other and adjacent to each other on the rear surface 4, three projecting wirings 12 are formed, that is, a total of twelve projecting wirings 12 are formed.

By replacing the substrate body 2a with the substrate body 2b, 2c, the rear surface electrodes 10 having the projecting wirings 12 in the above form can also be applied to the wiring substrate 1b, 1c.

In the wiring substrates 1a to 1c as described above, the projecting wirings 12 are formed crossing the part 4z of the rear surface 4 such that the plurality of rear surface electrodes 10 formed on the rear surface 4 of the substrate body 2a to 2c are separated from the long sides 4a and the short sides 4b of the rear surface 4. If the outer circumferential sides of the plurality of rear surface electrodes 10 formed on the rear surface 4 of the substrate body 2a to 2c are in contact with the long sides 4a and the short sides 4b of the rear surface 4, the outer circumferential sides of the rear surface electrodes 10 are exposed on the side surfaces 5. In the case where the wiring substrate in this form is mounted on a motherboard such as a printed board, when solder used for the mounting is cooled and solidified, a tensile force acts on the rear surface electrodes 10, so that the rear surface electrodes 10 may be peeled from a boundary between the rear surface electrodes 10 exposed on the side surfaces 5, and the substrate body 2a to 2c. Particularly, in the case where the side surfaces 5 of the substrate body 2a to 2c have grooved surfaces on the front surface 3 side and fracture surfaces on the rear surface 4 side, if the rear surface electrodes 10 are exposed in the vicinity of the fracture surface, the rear surface electrodes 10 are likely to be peeled.

In contrast, in the wiring substrate 1a to 1c, since the outer circumferential sides of the rear surface electrodes 10 are not exposed on the side surfaces 5, even if a tensile force acts on the rear surface electrodes 10 when solder used for the mounting is cooled and solidified, trouble such as peeling of the outer circumferential sides of the rear surface electrodes 10 is less likely to occur.

If the projecting wirings 12 are greatly exposed on the side surface 5, the rear surface electrodes 10 may be likely to be peeled, as in the case where the outer circumferential sides of the rear surface electrodes 10 are in contact with the long sides 4a and the short sides 4b of the rear surface 4. Therefore, it is necessary to choose and design the width and the thickness of the projecting wiring 12, and an area thereof exposed on the side surface, as appropriate.

In addition, one or two projecting wirings 12 are formed between each rear surface electrode 10 and each of the corresponding pair of the long side 4a and the short side 4b that intersect (orthogonally) with each other on the rear surface 4 of the substrate body 2a to 2c. Therefore, in a multi-piece wiring substrate 20 described later which includes a plurality of the wiring substrates 1a to 1c arranged along the longitudinal direction and the transverse direction, between the adjacent wiring substrates 1a to 1c, at least one connection wiring 32 composed of their mutual projecting wirings 12 is formed for each of the long sides 4a and short sides 4b on the rear surface 4 of each substrate body 2a to 2c. Therefore, when plating current is applied, the plating current flows along the longitudinal direction, the transverse direction, and the oblique direction on the plurality of wiring substrates 1a to 1c. Thus, in the wiring substrates 1a to 1c, desired metal plating films reliably cover surfaces of conductive portions exposed to outside, such as the plurality of rear surface electrodes 10, the metal ring 7 or the frame-shaped metalized layer 14, and the mount electrodes 8a and 8b formed on the front surfaces 3, 3b of the substrate bodies 2a to 2c.

Figure 7:
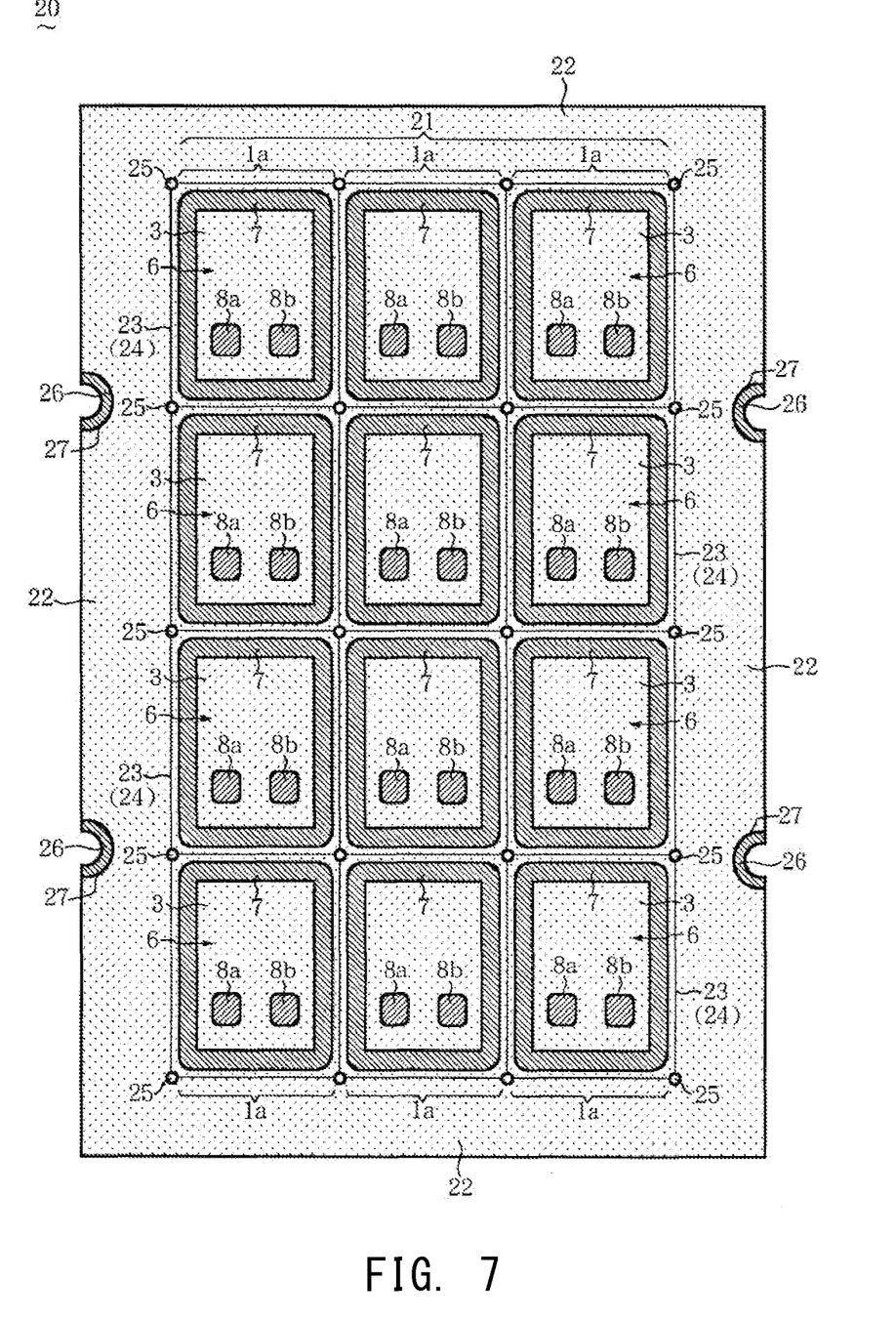
FIG. 7 is a plan view of a multi-piece wiring substrate according to an embodiment of the present invention.
Figure 8:
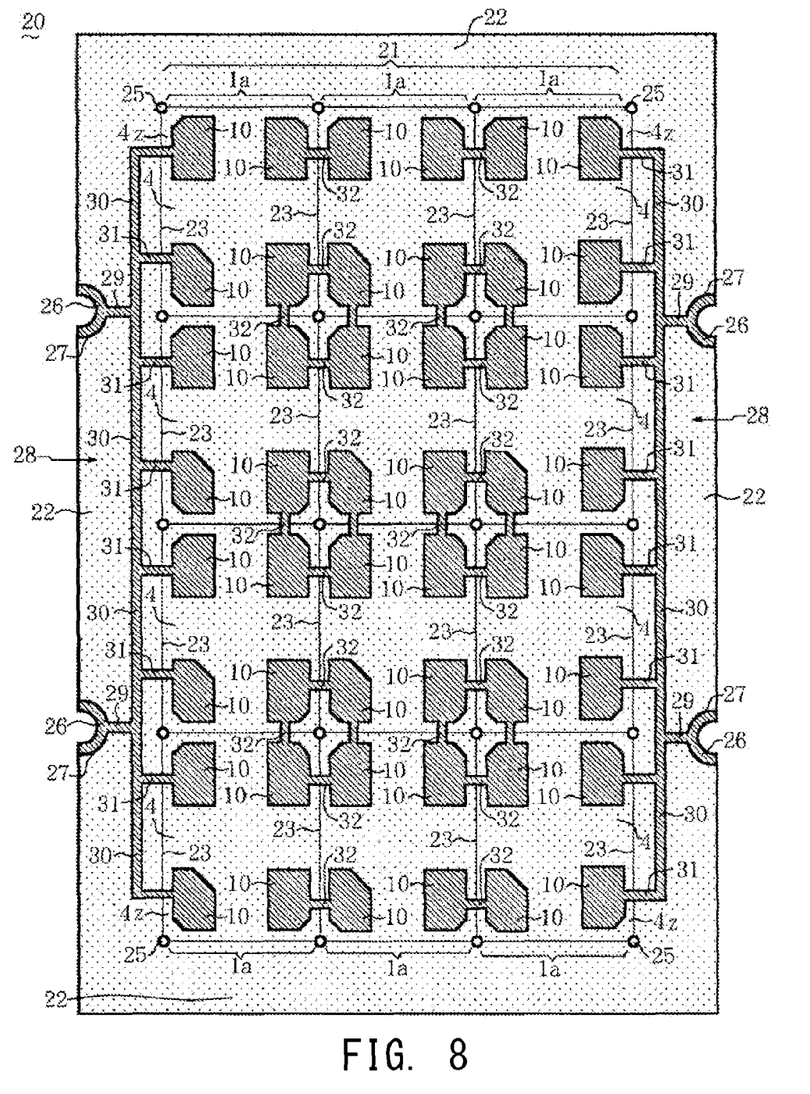
FIG. 8 is a bottom view showing the multi-piece wiring substrate.
Figure 9:
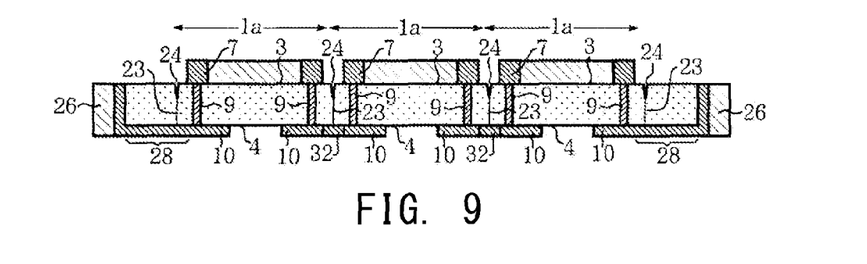
FIG. 9 is a vertical sectional view schematically showing an electric conduction structure of the multi-piece wiring substrate.

FIG. 7 is a plan view of a multi-piece wiring substrate 20 including a plurality of the wiring substrates 1a arranged along the longitudinal direction and the transverse direction. FIG. 8 is a bottom view of the multi-piece wiring substrate 20. FIG. 9 is a vertical sectional view schematically showing an electric conduction structure of the multi-piece wiring substrate 20.

As shown in FIGS. 7 and 8, the multi-piece wiring substrate 20 includes: a product region 21 having a rectangular shape in a plan view, in which a plurality of the wiring substrates 1a are arranged adjacently along each of the longitudinal direction and the transverse direction; and a marginal portion 22 which is made of the same ceramic (insulating material) as described above, has a front surface 3 and a rear surface 4, surrounds the product region 21, and has a rectangular frame shape in a plan view. Between the plurality of wiring substrates 1a located in the product region 21, and between the product region 21 and the marginal portion 22, virtual boundaries 23 partitioning them are set in advance in a lattice shape in a plan view. At each position where the boundaries 23 orthogonally intersect with each other, a through hole 25 having a circular shape in a plan view is formed. The through holes 25 form the arc walls 5a when the wiring substrates 1a are divided into individual pieces later.

At the periphery of a pair of long sides opposed to each other, of the marginal portion 22, two concave grooves 27 having a semicircular shape in a plan view are formed for each long side. A plating electrode 26 having a semicircular shape in a plan view and a semicylindrical shape as a whole is formed along an inner wall surface of each concave groove 27.

As shown in FIG. 8, between a pair of the plating electrodes 26 located at each long side of the marginal portion 22, and the rear surface electrodes 10 of each wiring substrate 1a located on the peripheral sides of the product region 21, a plating wiring 28 is formed for establishing electric connection therebetween. The plating wiring 28 is composed of: a trunk line portion 30 elongated in the longitudinal direction along each long side of the marginal portion 22; a root line portion 29 extending from the trunk line portion 30 to each plating electrode 26; and a branch line portion 31 extending from the trunk line portion 30 to each rear surface electrode 10 of each wiring substrate 1a.

Further, as shown in FIG. 8, in the product region 21, between the rear surface electrodes 10 and 10 of a pair of the wiring substrates 1a that are adjacent to each other along each of the longitudinal direction and the transverse direction, a connection wiring 32 is formed for electrically connecting these rear surface electrodes 10 and 10 over (across) the boundary 23.

In addition, as shown in FIG. 9, on the front surface 3 side at the boundary 23, division grooves 24 with a desired depth from the front surface 3 are formed in a lattice shape in a plan view. The division grooves 24 are formed by an edged tool being inserted from the front surface side of a single layer green sheet including the wiring substrates 1a in the product region 21 and the marginal portion 22 so as to present a lattice shape in a plan view in order to manufacture the multi-piece wiring substrate 20. A vertical cross section of the division groove 24 is a V shape.

The plating wiring 28 is also made of W, Mo, or Cu as described above.

The branch line portion 31 includes, in the product region 21, a part to become each projecting wiring 12 when the plurality of wiring substrates 1a are divided into individual pieces later. Upon this division, the connection wiring 32 is divided into each projecting wiring 12 of the respective wiring substrates 1a.

The metal ring 7 used for the wiring substrate 1a is fixed on the peripheral part of the front surface 3 via brazing material (not shown) such as Ag solder. Meanwhile, due to size reduction of each wiring substrate 1a, a pitch between the adjacent metal rings 7 is narrowed on the multi-piece wiring substrate 20. As a result, if a sufficient amount of brazing material is used for the fixing, the brazing material may flow out to the brazing material for the adjacent wiring substrate 1a. Therefore, in the multi-piece wiring substrate 20 including a plurality of wiring substrates 1a arranged in the longitudinal direction and the transverse direction, the division grooves 24 are formed along the boundaries 23 on the front surface 3 side, so that the brazing material can enter the division groove 24, whereby the brazing material can be prevented from flowing to the adjacent wiring substrate 1a. Since the division grooves 24 are formed on the front surface 3 side, the connection wirings 32 for electrically connecting the rear surface electrodes 10 and 10 over (across) the boundary 23 on the rear surface 4 side are formed on the rear surface 4 side.

Upon the above division, the through holes 25 become the arc walls 5a located at corners of the substrate body 2a of each wiring substrate 1a.

In addition, a laser beam may be scanned and radiated in a lattice shape in a plan view from the front surface side of the green sheet, thereby causing a vertical cross section of the division groove 24 to be a U shape.

In the multi-piece wiring substrate 20 as described above, as shown in FIG. 9, when current is applied with an electrode rod or the like brought into contact with the plating electrode 26 at one long side of the marginal portion 22, the plating current flows via the plating wirings (29 to 31) through the rear surface electrode 10 on the peripheral side of each wiring substrate 1a on the peripheral side in the product region 21, the via conductor 9, the metal ring 7, the via conductor 9, and then the rear surface electrode 10 on the center side in the product region 21. Further, the plating current flows via the connection wirings 32 through the rear surface electrode 10 of the adjacent wiring substrate 1a, the via conductor 9, the metal ring 7, the via conductor 9, and then the rear surface electrode 10 opposite to the initial one. Thereafter, the plating current flows through the plating wiring 28 on the other long side to the plating electrode 26 on the other long side in the marginal portion 22. At this time, the plating current reliably flows along the longitudinal direction, the transverse direction, and the oblique direction via the connection wirings 32 between the rear surface electrodes 10 of the plurality of wiring substrates 1a that are adjacent to each other along the longitudinal direction and the transverse direction in the product region 21.

Thus, the multi-piece wiring substrate 20 can provide a plurality of wiring substrates 1a in which surfaces of the rear surface electrodes 10, the metal rings 7, and the mount electrodes 8a and 8b, which are exposed to outside, are reliably covered with desired metal plating films made of, for example, Ni or Au, when the wiring substrates 1a are divided into individual pieces along the division grooves 24.

The multi-piece wiring substrate 20 may include a plurality of the wiring substrates 1b or a plurality of the wiring substrates 1c arranged in the longitudinal direction and the transverse direction in the product region 21. Of these, also in the case of wiring substrate 1c, division grooves 24 are formed at the boundary 23 on the front surface 3 side, but it is necessary to make the division grooves 24 deeper by an amount corresponding to the thickness of the ceramic layers c1 and c2, than in the case of using the wiring substrate 1a. In this configuration, in the multi-piece wiring substrate 20, since the connection wirings 32 for electrically connecting the rear surface electrodes 10 and 10 over (across) the boundary 23 are formed on the rear surface 4 side, it is easy to increase the depth of the division groove 24.

Figure 10:
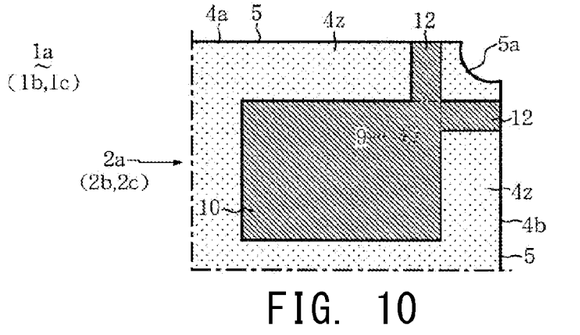
FIG. 10 is a partial bottom view showing a relationship between the rear surface electrode and projecting wirings.

FIG. 10 is a partial bottom view showing a relationship between the rear surface electrode 10 and the projecting wirings 12.

The rear surface electrode 10 formed on each corner side of the rear surface 4 of the substrate body 2a to 2c of the wiring substrate 1a to 1c presents almost a rectangular shape in a bottom view, and from the middle between two outer sides of the rear surface electrode 10, at least one projecting wiring 12 (a pair of projecting wirings 12) extends to each of the long side 4a and the short side 4b that intersect with each other on the rear surface 4.

As shown in FIG. 10, in the rear surface electrode 10 formed on each corner side of the rear surface 4, a pair of projecting wirings 12 that are adjacent via the corner so as to intersect (orthogonally) with each other may be formed such that at least base portions of the pair of projecting wirings 12 are directly connected to the outer sides of the rear surface electrode 10 without intersecting with each other. The rear surface electrode 10 including a pair of projecting wirings 12 in this form is applicable to all the wiring substrates 1a to 1c, and can also be included in the multi-piece wiring substrate 20.

Figure 11:
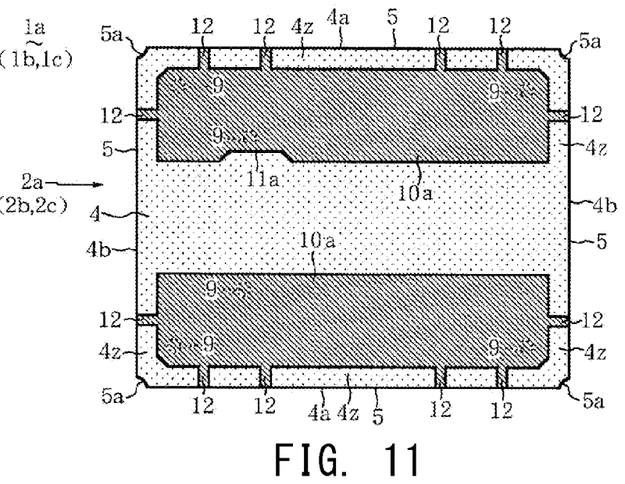
FIG. 11 is a bottom view of the wiring substrate having rear surface electrodes according to another embodiment.

FIG. 11 is a bottom view of the wiring substrate 1a having rear surface electrodes 10a according to another embodiment.

As shown in FIG. 11, on the rear surface 4 of the substrate body 2a of the wiring substrate 1a, a pair of rear surface electrodes 10a presenting an elongated rectangular (trapezoidal) shape in a bottom view are formed along a pair of the long sides 4a of the rear surface 4 so as to be separated via the belt-like rear surface parts 4z from the long sides 4a and a pair of the short sides 4b adjacent thereto. The rear surface electrode 10a has two projecting wirings 12 on each corner side of the long side 4a of the rear surface 4, i.e., a total of four projecting wirings 12, and one projecting wiring 12 at each corner side of a pair of right and left short sides 4b opposed to each other, so as to extend to the long side 4a or the short sides 4b, respectively. On the inner side of the upper rear surface electrode 10a in FIG. 11, a concave portion 11a is formed for identifying a position and an orientation.

The above rear surface electrode 10a including a plurality of projecting wirings 12 is also applicable to the wiring substrates 1b and 1c, and can also be included in the multi-piece wiring substrate 20.

The pair of rear surface electrodes 10a may be formed so as to be respectively close to the pair of short sides 4b of the rear surface 4, in the same manner as described above.

Figure 12:
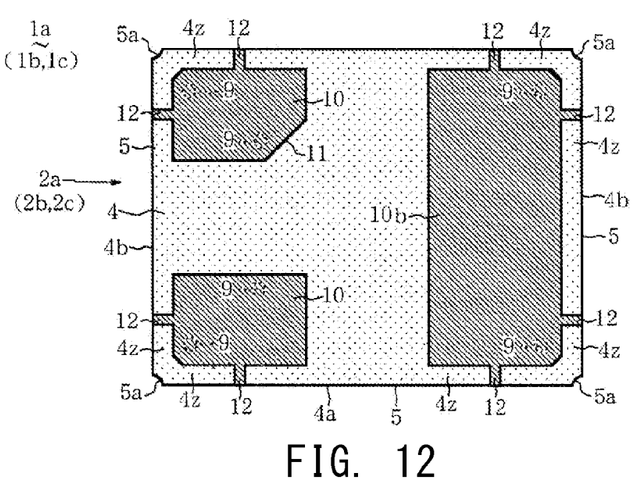
FIG. 12 is a bottom view of the wiring substrate having rear surface electrodes according to still another embodiment.

FIG. 12 is a bottom view of the wiring substrate 1a including rear surface electrodes 10b according to still another embodiment.

As shown in FIG. 12, on the rear surface 4 of the substrate body 2a of the wiring substrate 1a, at the left of the rear surface 4, a pair of the same rear surface electrodes 10 as described above are formed on respective corner sides, and at the right of the rear surface 4, one rear surface electrode 10b presenting a rectangular shape or a trapezoidal shape in a bottom view is formed along the vicinity of the right short side 4b in FIG. 12 so as to be separated via the belt-like rear surface part 4z from the short side 4b and the pair of long sides 4a adjacent thereto. That is, on the rear surface 4, a pair of rear surface electrodes 10 and one rear surface electrode 10b, i.e., a total of three rear surface electrodes are formed. The rear surface electrode 10b has one projecting wiring 12 on each corner side of the right short side 4b and one projecting wiring 12 on each corner side of the pair of long sides 4a adjacent to the short side 4b, that is, has a total of four projecting wirings 12 extending toward the respective sides 4a and 4b.

The configuration of providing a pair of rear surface electrodes 10 and one rear surface electrode 10b, i.e., a total of three rear surface electrodes as described above is also applicable to the wiring substrates 1b and 1c, and can also be included in the multi-piece wiring substrate 20.

Alternatively, on the rear surface 4, one rear surface electrode 10a may be formed along the vicinity of one long side 4a, and two rear surface electrodes 10 may be formed on the respective corner sides at both ends of the other long side 4a.

Figure 13:
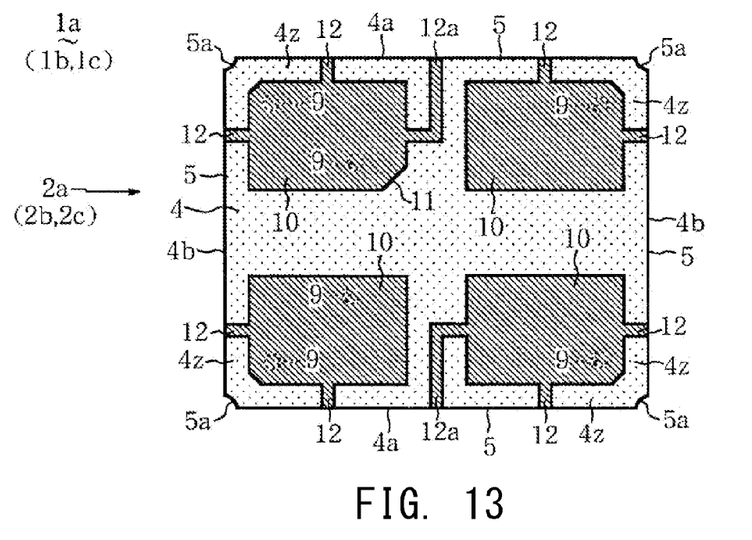
FIG. 13 is a bottom view of the wiring substrate having rear surface electrodes according to an application embodiment.

FIG. 13 is a bottom view showing an application embodiment of the embodiment shown in FIG. 3 in which, on the rear surface 4 of the substrate body 2a of the wiring substrate 1a, four rear surface electrodes 10 are respectively provided on corner sides of the rear surface 4.

As shown in FIG. 13, on the rear surface 4 of the substrate body 2a, four rear surface electrodes 10 are respectively formed on corner sides of the rear surface 4 in the same manner as described above, and one projecting wiring 12 is formed at the rear surface part 4z between the middle of each outer side of each rear surface electrode 10, and each of the long side 4a and the short side 4b of the rear surface 4. Further, among the pairs of right and left rear surface electrodes 10 that are adjacent to each other respectively along the pair of upper and lower long sides 4a on the rear surface 4, the upper left rear surface electrode 10 and the lower right rear surface electrode 10 in FIG. 13 have projecting wirings 12a presenting an L shape in a bottom view and point-symmetrically extending from an inner side thereof opposed to the adjacent rear surface electrode 10 at the right or left, to the vicinity of the middle of the corresponding long side 4a.

The pair of projecting wirings 12a are also applicable to the wiring substrates 1b and 1c, and are also applicable to the rear surface 4 shown in FIG. 6 in the same manner.

Figure 14:
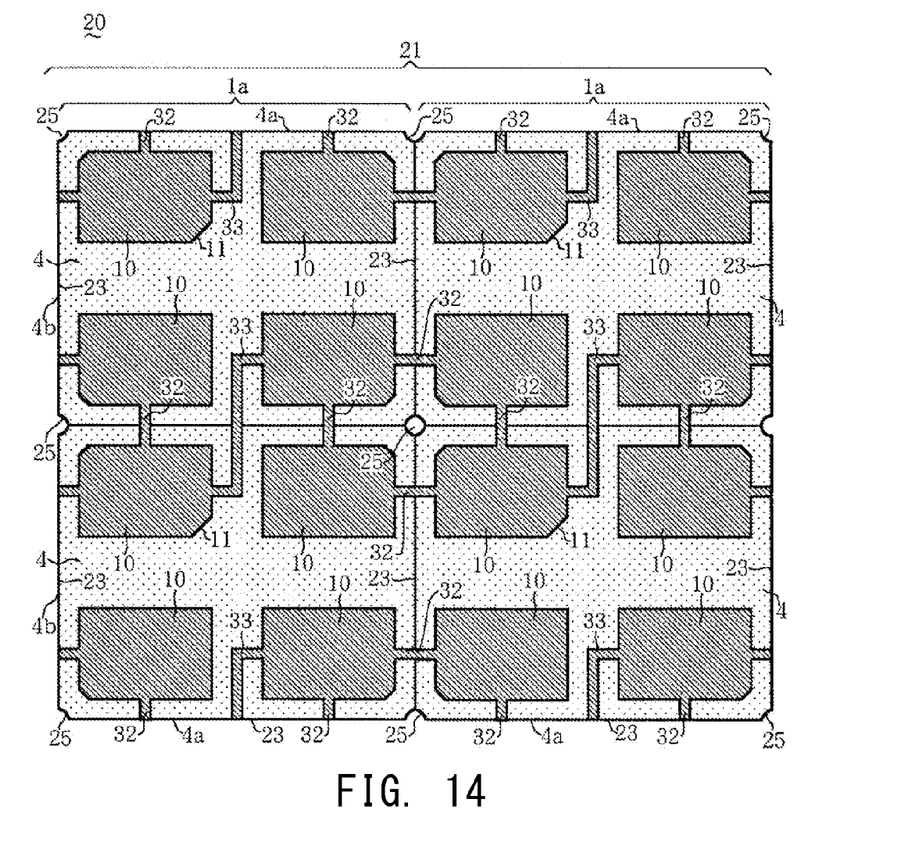
FIG. 14 is a partial bottom view of a multi-piece wiring substrate including a plurality of the wiring substrates.

FIG. 14 is a partial bottom view showing a part of the product region 21 of the multi-piece wiring substrate 20 including a plurality of the wiring substrates 1a arranged adjacently to each other in the longitudinal direction and the transverse direction.

As shown in FIG. 14, on each rear surface 4 of the substrate bodies 2a of the plurality of wiring substrates 1a partitioned by the boundary 23 in the same manner as described above, each of the rear surface electrodes 10 located on corner sides of each rear surface 4, and the corresponding rear surface electrode 10 of another wiring substrate 1a adjacent thereto via the boundary 23, are electrically connected to each other by the connection wiring 32 which connects the middles of the respective opposed outer sides of both rear surface electrodes 10. Further, on the rear surfaces 4 of a pair of wiring substrates 1a that are adjacent to each other via the boundary 23 and their long sides 4a, a connection wiring 33 orthogonally intersecting at the middle of the boundary 23 and presenting a Z shape or a crank shape that is longitudinally elongated in a plan view is formed between inner sides of a pair of rear surface electrodes 10 that are located diagonally via the boundary 23 and their long sides 4a. The connection wiring 33 serves as the projecting wiring 12a for each wiring substrate 1a when the multi-piece wiring substrate 20 is divided into a plurality of wiring substrates 1a along the boundaries 23 later.

If the connection wiring 33 as described above is added to the rear surface 4 of the substrate body 2a of each wiring substrate 1a in the product region 21 of the multi-piece wiring substrate 20, it becomes possible to further reliably and uniformly apply the plating current to all the conductive portions such as the rear surface electrodes 10 on the plurality of wiring substrates 1a.

The configuration of further forming the pair of projecting wirings 12a for the pair of rear surface electrodes 10 on the rear surface 4 is also applicable to the wiring substrates 1b and 1c, and a plurality of the resultant wiring substrates 1b or 1c may be arranged in the product region 21 to form the multi-piece wiring substrate 20.

The present invention is not limited to any of the embodiments described above.

For example, the insulating material for the substrate body may be resin such as epoxy resin. The substrate body made of the resin may be, for example, formed as a so-called copper clad resin substrate obtained by attaching copper foils on both surfaces of a single layer resin plate, or may be formed by integrally stacking a plurality of flat resin layers, or a flat resin layer and a frame-shaped resin having a rectangular frame shape.

The substrate body may be formed by stacking a ceramic layer and a resin layer.

The shapes of the front surface and the rear surface of the substrate body are not limited to the rectangular shape having a pair of long sides and a pair of short sides, but may be a square shape with four sides having almost the same length.

The arc wall located at each corner of the substrate body may be omitted, and accordingly, the through holes of the multi-piece wiring substrate may be omitted.

Five or more (for example, six or eight) rear surface electrodes may be formed so as to be separated from each other on the rear surface of the substrate body.

As for the via conductors, at least one via conductor is formed between each of the plurality of rear surface electrodes, and the frame-shaped conductive portion on the front surface side of the substrate body. However, in the case where the total number of the rear surface electrodes formed on the rear surface of each substrate body is three or greater, at least one via conductor may be formed between each of two of the rear surface electrodes, and the frame-shaped conductive portion.

The projecting wiring may be, without being limited to a rectangular shape in a bottom view, formed in an elongated parallelogram shape (oblique shape), a curved-line shape, a trapezoidal shape, or the like in a bottom view, between (in a part of the rear surface) the rear surface electrode and each side of the substrate body.

In the multi-piece wiring substrate, the product region may present a square shape in a plan view, and the outer shape and the inner shape of the marginal portion may also be a frame shape almost similar to the square shape.

In the multi-piece wiring substrate, the plating electrode and the plating wiring may be provided for each of the four sides of the marginal portion.

INDUSTRIAL APPLICABILITY

The present invention can reliably provide: a wiring substrate which allows various electronic components such as a crystal oscillator to be mounted on a surface of a substrate body so that the electronic components can be sealed, allows a surface of a conductor exposed to outside to be reliably covered with a metal plating film, and suppresses occurrence of trouble of a rear surface electrode upon mounting to a motherboard; and a multi-piece wiring substrate including a plurality of the wiring substrates.

DESCRIPTION OF REFERENCE NUMERALS 1a to 1c: wiring substrate
2a to 2c: substrate body
3, 3b: front surface
4: rear surface
4a: long side (side)
4b: short side (side)
4z: part of rear surface
7: metal ring (frame-shaped conductive portion)
9: via conductor
10, 10a, 10b: rear surface electrode
12, 12a: projecting wiring
14: frame-shaped metalized layer (frame-shaped conductive portion)
20: multi-piece wiring substrate
21: product region
22: marginal portion
26: plating electrode
28: plating wiring
32, 33: connection wiring

What is claimed is:

1. A wiring substrate comprising:
a substrate body made of insulating material and having a front surface and a rear surface, the front surface and the rear surface each having a rectangular shape in a plan view and the rear surface having edges;
a plurality of rear surface electrodes formed on the rear surface of the substrate body, each of the plurality of rear surface electrodes positioned adjacent to a corresponding pair of edges of the rear surface that intersect with each other, and with a part of the rear surface exposed between the plurality of rear surface electrodes and each edge of the rear surface;
a frame-shaped conductive portion provided on a front surface side of the substrate body and having a rectangular frame shape in a plan view;
a via conductor penetrating the substrate body and establishing electric connection between the plurality of rear surface electrodes and the frame-shaped conductive portion, and
at least one projecting wiring formed on the rear surface of the substrate body between each of the plurality of rear surface electrodes and each of the corresponding pair of edges adjacent to the rear surface electrode.

2. A wiring substrate according to claim 1, wherein the rear surface of the substrate body has four corners and one of the plurality of rear surface electrodes is formed on the rear surface of the substrate body at each of the four corners of the rear surface.

3. A multi-piece wiring substrate comprising:
a product region having a peripheral side and including a plurality of wiring substrates arranged adjacently along each of a longitudinal direction and a transverse direction in a plan view with a boundary between each of the plurality of wiring substrates, each of the plurality of wiring substrates including
a substrate body made of insulating material and having a front surface and a rear surface, the front surface and the rear surface each having a rectangular shape in a plan view and the rear surface having edges,
a plurality of rear surface electrodes formed on the rear surface of the substrate body, each of the plurality of rear surface electrodes positioned adjacent to a corresponding pair of edges of the rear surface that intersect with each other, and with a part of the rear surface exposed between the plurality of rear surface electrodes and each edge of the rear surface,
a frame-shaped conductive portion provided on a front surface side of the substrate body and having a rectangular frame shape in a plan view,
a via conductor penetrating the substrate body and establishing electric connection between the plurality of rear surface electrodes and the frame-shaped conductive portion, and
at least one projecting wiring formed on the rear surface of the substrate body between each of the plurality of rear surface electrodes and each of the corresponding pair of edges adjacent to the rear surface electrode;
a marginal portion made of the same insulating material as the substrate body of each of the plurality of wiring substrates, having a front surface and a rear surface, surrounding the product region, and presenting a rectangular frame shape in a plan view;
a plurality of plating electrodes formed at a periphery of the marginal portion; and
a plating wiring establishing electric connection between each plating electrode of the marginal portion and the projecting wirings of each wiring substrate of the plurality of wiring substrates that is located on the peripheral side of the product region, wherein
a pair of adjacent wiring substrates are electrically connected to each other via a connection wiring crossing the boundary between the pair of adjacent wiring substrates, the connection wiring including one projection wiring of each of the pair of adjacent wiring substrates.

4. A multi-piece wiring substrate according to claim 3, wherein a division groove is formed on a front surface side of the product region along the boundary between each of the plurality of wiring substrates, the division groove having a lattice shape in a plan view.

5. A multi-piece wiring substrate according to claim 3, wherein for each of the plurality of wiring substrates, the rear surface of the substrate body has four corners and one of the plurality of rear surface electrodes is formed on the rear surface of the substrate body at each of the four corners of the rear surface.

6. A multi-piece wiring substrate according to claim 5, wherein a division groove is formed on a front surface side of the product region along the boundary between each of the plurality of wiring substrates, the division groove having a lattice shape in a plan view.

\* \* \* \* \*